(12) United States Patent
Bohlender et al.

(10) Patent No.: US 7,148,453 B2
(45) Date of Patent: Dec. 12, 2006

(54) CONTROL UNIT WITH THERMAL PROTECTION AND AN ELECTRICAL HEATING DEVICE COMPRISING THE CONTROL UNIT

(75) Inventors: Franz Bohlender, Kandel (DE); Michael Zeyen, Landau/Queichheim (DE); Michael Niederer, Kapellen-Drusweiler (DE); Günter Uhl, Helmstadt-Bargen (DE)

(73) Assignee: Catem GmbH & Co. KG, Herxheim Bei Landau (DE)

( * ) Notice: Subject to any disclaimer, the term of this patent is extended or adjusted under 35 U.S.C. 154(b) by 0 days.

(21) Appl. No.: 11/004,654

(22) Filed: Dec. 3, 2004

(65) Prior Publication Data

US 2005/0173394 A1 Aug. 11, 2005

(30) Foreign Application Priority Data

Jan. 28, 2004 (EP) .................... 04001824

(51) Int. Cl.
*H01H 37/76* (2006.01)
*H01H 85/00* (2006.01)
*H05B 1/02* (2006.01)
*H05B 3/50* (2006.01)

(52) U.S. Cl. ............. 219/491; 219/490; 219/510; 219/517; 219/530; 337/144; 361/104

(58) Field of Classification Search ........... 219/490, 219/491, 209, 210, 517, 530; 337/143, 144, 337/401; 361/103, 104
See application file for complete search history.

(56) References Cited

U.S. PATENT DOCUMENTS

| 4,536,641 | A | * | 8/1985 | Chan ................. 219/253 |
| 4,758,876 | A | | 7/1988 | Calenda et al. |
| 5,123,490 | A | * | 6/1992 | Jenne ................. 169/61 |
| 5,280,262 | A | * | 1/1994 | Fischer ............... 337/405 |
| 5,363,083 | A | * | 11/1994 | Fischer ............... 337/407 |
| 5,608,196 | A | * | 3/1997 | Hall et al. ........... 200/61.19 |
| 5,770,993 | A | * | 6/1998 | Miyazawa et al. ...... 337/160 |
| 5,804,798 | A | * | 9/1998 | Takeda ............... 219/511 |
| 6,348,851 | B1 | * | 2/2002 | Wyser et al. .......... 337/411 |
| 6,392,207 | B1 | * | 5/2002 | Beetz et al. .......... 219/530 |
| 6,612,662 | B1 | * | 9/2003 | Ohtsu ................. 303/156 |
| 6,664,885 | B1 | * | 12/2003 | Bromley et al. ....... 337/104 |
| 2002/0170399 | A1 | * | 11/2002 | Gass et al. ........... 83/62.1 |

(Continued)

FOREIGN PATENT DOCUMENTS

EP 0 706 194 A 4/1996

(Continued)

*Primary Examiner*—Robin O. Evans
*Assistant Examiner*—Stephen J. Ralis
(74) *Attorney, Agent, or Firm*—Boyle Fredrickson Newholm Stein & Gratz S.C.

(57) ABSTRACT

An overheating protection system for a control unit includes an interrupter element, which, in its initial position defined with respect to a circuit board, electrically connects the opposite facing ends of at least one track on the circuit board, and an actuating element which is activated with the overheating of the transistor, and which on actuation against the interrupter element takes effect and releases it at least so far from the tract that the electrical connection is interrupted. A preassembled actuating unit for the interrupter element of the overheating protection is comprises an accommodation housing, in which an actuating element is accommodated and which can be brought into interaction with the interrupter element and which is held releasably by a one-piece latching element formed on the accommodation housing under pretension. An electrical heating device with a control unit protected against overheating is also provided.

12 Claims, 4 Drawing Sheets

U.S. PATENT DOCUMENTS

2004/0222018 A1* 11/2004 Sullivan et al. ............... 175/39
2005/0120980 A1* 6/2005 Dolan ...................... 122/14.1

FOREIGN PATENT DOCUMENTS

| EP | 0706194 A | * | 4/1996 |
| EP | 1 157 867 A | | 11/2001 |
| EP | 1157867 A | * | 11/2001 |
| FR | 2 521 770 A | | 8/1983 |
| FR | 2521770 A | * | 8/1983 |

* cited by examiner

CONTROL UNIT WITH THERMAL PROTECTION AND AN ELECTRICAL HEATING DEVICE COMPRISING THE CONTROL UNIT

BACKGROUND OF THE INVENTION

1. Field of the Invention

The present invention relates to a control unit with circuit board comprising at least one track and a transistor mounted on the circuit board and electrically connected with at least one track.

2. Description of the Related Art

These types of control units, which comprise a transistor as semiconductor control element, are used in a large number of applications, for example also for the control of drive, heating and lighting devices in motor vehicles and particularly where, due to the many devices to be controlled in an overall apparatus, it is important to manufacture the individual control units as economically as possible.

Various applications are conceivable in which, for example, due to the current to be controlled and passed through the track, overheating of the control unit may occur. Such malfunctions are in particular caused by previous damage to the transistor. During the mass production of transistors, this previous damage only occurs in the parts per million (ppm) range. However, since the transistors, in particular with inexpensive mass production, are arranged on injection moulded parts or are surrounded by them, overheating of the transistors also leads to overheating of the surrounding plastic parts. The plastic begins to smoulder at the temperatures of overheating, for example in the region of 300° C., and in the worst case it burns. Consequently, the device in which the control unit is installed can be partially or completely destroyed.

Such control units are also used, for example, in electrical heating devices for motor vehicles, such as is known, for example, from EP-A-0 359 528. For applications in motor vehicles, in particular in motor vehicles with consumption-optimised diesel engines and, in future, also petrol-driven engines in which a smaller amount of the heat energy arises, electrical auxiliary heaters are used for heating the interior and engine. Electrical heating devices are also suitable for other applications, for example in the field of house installations, in particular for room air conditioning, industrial plants, etc.

Through the use of electrical auxiliary heaters in the heating/air conditioning system of a motor vehicle, the time period can be spanned in which the waste heat from the engine is not yet available for heating purposes. Electrical auxiliary heaters reach their operating temperature after just a few seconds and can therefore accordingly heat up the air flowing through.

For such electrical auxiliary heaters, which are employed in heating/air conditioning systems in motor vehicles, Positive Temperature Coefficient (PTC) heating elements are preferably used which convert the electrical current into heat. The PTC heating elements are joined to radiator elements of the auxiliary heating for thermal conduction. The heat produced by the PTC heating elements is transferred to the air flowing through by means of the radiator elements.

The overall arrangement of a layered structure of PTC heating elements, radiator elements and contact plates, which provide the current feed, is subjected to a clamping pressure to increase the efficiency. Due to the clamping, an improvement in the electrical and thermal contact to the PTC heating elements is achieved.

The control of the heating power is being handled to an increasing extent by semiconductor components which replace relay controllers. In dependence of the demanded heating power, the control units control in a closed-loop mode the current fed to the individual PTC heating elements. Preferably, the semiconductor components operate as switches which switch the current passed to the individual PTC heating elements on or off. For more exact dosing of the heating power the current passed to the heating elements can with the aid of the semiconductor components also be continuously adjusted. A disadvantage of such a continuous closed-loop control is the ensuing high power dissipation which is converted into heat and can therefore also contribute to overheating.

The semiconductor components used for regulating the current can be obtained in a large number of variants with different additional functions. Complex and expensive transistors have many of so-called "smart power control" functions. Using them, it is possible, for example, to realise automatic temperature monitoring of the transistor. A disadvantage with such transistors is however their high price, so that they are only used in high priced vehicles.

With the overheating of this type of control device of an auxiliary heater in a motor vehicle, the gases produced by the smouldering plastics spread directly through the ventilation system of the motor vehicle and enter the passenger compartment. Then persons located in the passenger compartment directly suffer health impairment due to the emitted gases. Also the emitted gases cloud up the passenger compartment and impair the view of the driver towards the outside and even completely block it.

Even with temperature monitoring of the transistor or through different electronic monitoring of the actual temperature for the timely switching off of the currents before overheating occurs, there is also the problem of insufficient reliability of the overheating protection which is thereby implemented. Also electrical overheating protection of the control unit represents an unsatisfactory solution, because also here the required reliability is not always achieved. Anyway, with high currents to be monitored, the realization of electrical overheating protection leads to a control unit of substantial installation size.

OBJECTS AND SUMMARY OF THE INVENTION

The object of the invention is to provide a control unit with reliable overheating protection.

According to a further aspect of this invention, reliable overheating protection should be provided which can be mounted on a control unit in a simple manner.

According to a third aspect of this invention, an electrical heating device, in particular for a motor vehicle, with a control device protected against overheating should be provided.

The solution of the first aspect of the object of the invention is specified with a control unit which includes interrupter element with an actuating element assigned to it. According to the invention, in its initial position defined with respect to the circuit board, the interrupter element electrically connects opposite facing ends of at least one track on the circuit board. The previously mentioned actuating element is an actuating element which is activated when the transistor overheats. This means that the actuating element is actuated only when an impermissibly high temperature on the transistor is exceeded. With this type of thermally induced activation of the actuating element, the actuating element acts against the interrupter element until it is released so far from the circuit board that the electrical connection of the two ends of the tracks is interrupted.

With this invention, according to the first aspect, an electromechanical solution is accordingly provided in which an interrupter element, moved mechanically in the case of overheating, is displaced from the initial position into a safety position in order to interrupt the electrical connection of the track leading to the transistor. The electromechanical solution principle proposed by the invention ensures reliable overheating protection for the control unit, which can be used in all conceivable cases, in which overheating of the control unit is to be expected. This overheating can, for example, be caused by the current passed through the track and controlled by the control unit, in particular in the transistor. Overheating protection is also possible for the control unit against heat to which the control unit is subjected from its immediate environment.

According to a preferred further development of this invention, the actuating element is pretensioned in its initial position and secured by a fusible element which is thermally coupled to the transistor. In this respect, the fusible element holds the actuating element in the initial position in which the actuating element is pretensioned in the acting direction. If the fusible element melts, then the fusible element releases the actuating element which moves away from its initial position and in this respect directly or indirectly acts on the interrupter element. The thermal coupling between the fusible element and the transistor is such that in each case the fusible element melts with impermissibly high temperatures in the transistor or in the immediate vicinity of the transistor. A fusible pin of acryl nitril butadien styrol (ABS) or polyvinyl chloride (PVC) can, for example, be used as fusible element. With this preferred development of the present invention the thermal activation of the actuating element is realized in a simple manner.

Preferably, the fusible element is arranged on the side of the circuit board facing away from the transistor and exhibits a thermal track extending in the track between the fusible element and the transistor. With this arrangement the transistor is preferably mounted as an SMD component (Surface Mounted Device) on the top side of the circuit board in order to be in direct thermal contact with the thermal track. The temperature prevailing in the region of the transistor is conducted by means of the thermal track to the bottom side of the circuit board to which the fusible element is secured against the circuit board, preferably lying directly against it. Since the pretensioned actuating element is secured by means of the fusible element, the actuating element also in any case indirectly lies against the circuit board with the fusible element in between, so that the electromechanical overheating protection according to the invention can be realized in a simple manner with few additional parts.

The thermal track is preferably formed from many holes in the circuit board filled with solder. In this way the thermal contacting between the transistor and the thermal protection element can be decoupled from the mechanical contacting. Consequently, a good thermal transition is obtained with mechanical relief of the solder point transistor-circuit board and it increases its reliability.

According to a further preferred development, which prevents a short circuit by the interrupter element in the case of overheating and with which the safety setting of the interrupter element is provided, it is formed by a contact plate soldered onto the circuit board, whereby the solder connection on the transistor side between the circuit board and the contact plate is thermally coupled to the transistor. With overheating, this thermal coupling of the solder connection with the transistor causes melting of the solder located in the solder connection. Simultaneously, the actuating element acts thermally induced and moves the contact plate. A further solder connection formed between the contact plate and the circuit board is so far thermally decoupled from the transistor that the contact plate is retained on the circuit board by means of this solder connection. This preferably occurs in that the circuit board exhibits an actuation opening cut out under the contact plate and in which the actuating end of the actuating element is accommodated in its initial position. On one side of this actuating opening the solder connection is located which is thermally coupled to the transistor. On the other side is the thermally decoupled solder connection about which the contact plate preferably swivels in the case of overheating. It is accordingly not expected that the contact plate can move freely in the control unit in the case of overheating of the transistor and, as the case may be, uncontrollably restore the interrupted electrical connection between the two ends of the track.

According to a further preferred development of this invention, the actuating element is formed by a punched deflector which is defined with respect to the circuit board. This punched deflector exhibits an elastically bent curved segment and an accommodation segment provided with a receptacle for retaining the fusible element and, extending between the curved segment and the accommodation segment, it also has a connecting segment, from which an actuating web, formed by cutting into the connecting segment, branches and which extends approximately at right angles to the circuit board. The previously mentioned integral punched deflector forming a spring represents an especially inexpensive and easily manufactured development of the actuating element and is realized with regard to the most inexpensive mass production possible for the control unit according to the invention.

Further preferred developments of the control unit according to the invention are also described herein. For the provision of overheating protection which is easy to assemble, according to this second aspect of this invention, a preassembled actuating unit is provided for an interrupter element, which comprises an accommodation housing in which an actuating element is accommodated and which can be brought into active connection with the interrupter element and which is held releasably under pretension by a one-piece latching element formed on the accommodation housing. The latching element acts as an assembly aid and holds the actuating element, secured to the accommodation housing, in a pretensioned initial position. The holding of the actuating element in this pretensioned position by the latching element is however releasable, i.e. the latching element is released during or after assembly of the preassembled actuating unit, for example, on a control unit with circuit board. The mechanical retention of the actuating element is then cancelled so that the actuating element can be activated solely by thermal means.

According to a preferred development of the actuating unit according to the invention, with which the retention of the actuating element under pretension by the latching element is achieved inevitably during the assembly of the actuating element, for example on the circuit board of a control unit, the latching element protrudes over a mounting surface of the accommodation housing and is supported for swivelling on it and exhibits a run-off ramp, with which the actuating element interacts during preassembly. During preassembly the actuating element, which is preferably formed as a punched deflector, is joined to an accommodation housing, preferably formed by plastic injection moulding, and is brought into the pretensioned position. In this respect the actuating element slides against the run-off ramp and pretensions it elastically so far that an abutment face following the actuating ramp acts against the actuating element when it reaches the initial position. The actuating element is forcibly secured accordingly on terminating the preassembly by the spring-return of the latching element in its initial position.

This securing of the actuating element is inevitably released with the abutment of the mounting surface of the accommodation housing against a counter surface according to a preferred embodiment in which the latching element is supported at its end facing away from the mounting surface for swivelling on the accommodation housing and at its other end on the side facing away from the run-off ramp it exhibits a crimped head overlapping the mounting surface. During assembly this head is pressed against the counter surface of the control unit towards the mounting surface and consequently swivelled about the bearing of the latching element on the accommodation housing so far until the abutment surface of the latching element releases the actuating element held under pretension. The securing of the actuating element for the purpose of assembly is then cancelled and the actuating element can be actuated thermally induced during overheating, free from the latching element.

For the solution of the third aspect of the object of the invention, according to the invention an electrical heating device is provided comprising a device housing, which holds a layer structure consisting of at least one radiator element and at least one parallel contact plate, which accommodate at least one PTC heating element between them. This electrical heating device, known for example from EP-A-0 350 528, is formed with this invention for providing reliable and economical protection against overheating with a control unit constructed in accordance with the invention.

Preferably, the electrical heating device exhibits an accommodation housing which comprises in a well-known manner a lateral strut extending laterally to the heat dissipating elements and spacing them electrically insulated from one another and on which the circuit board and the actuating element of the control unit according to the invention are held.

BRIEF DESCRIPTION OF THE DRAWINGS

In the following this invention is explained based on preferred embodiments in conjunction with the enclosed drawings. In detail the drawings show.

DETAILED DESCRIPTION OF THE PREFERRED EMBODIMENTS

Figure 1:
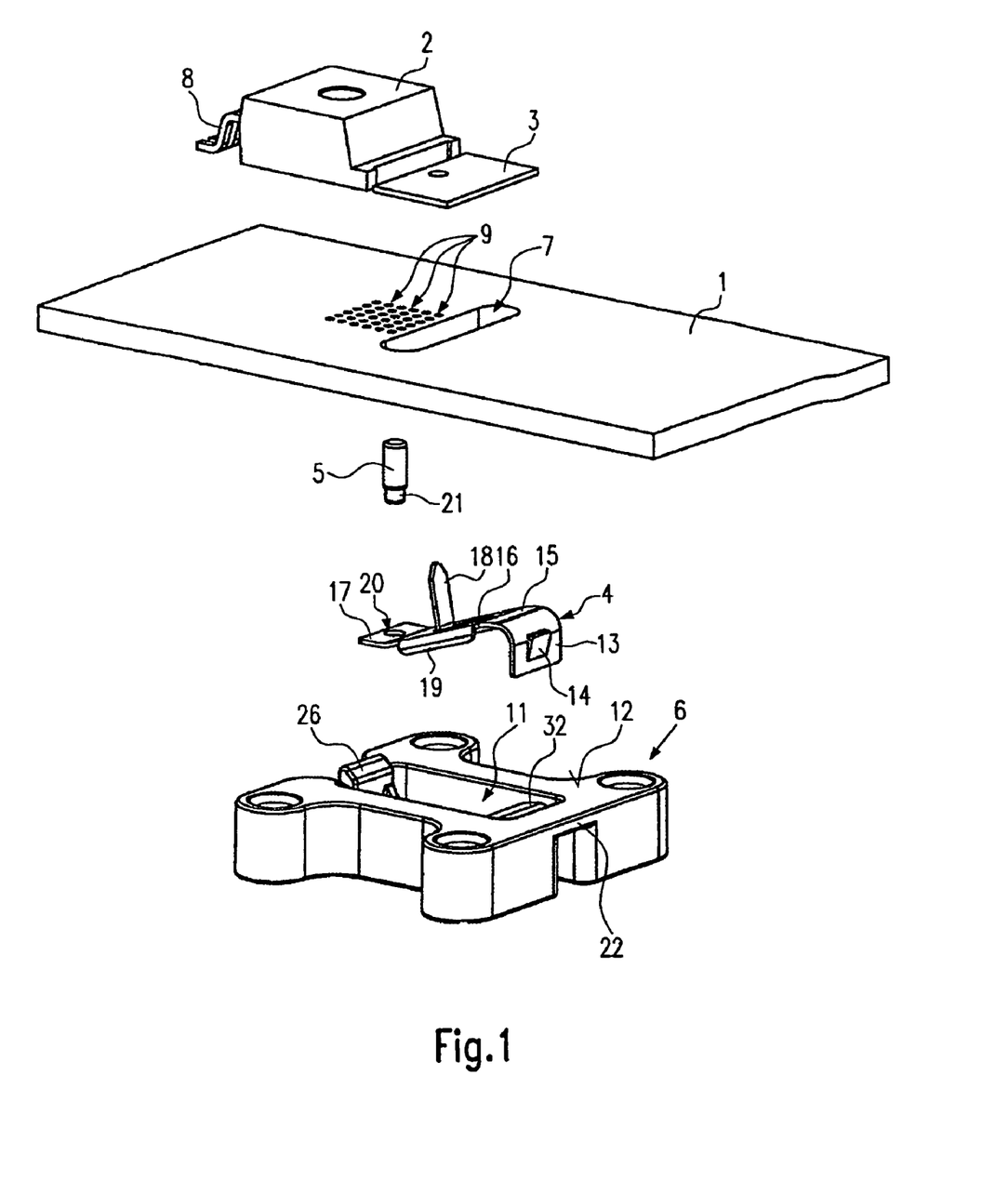
FIG. 1 an exploded view of an embodiment of a control unit according to the invention.

FIG. 1 shows an embodiment of a control unit according to the invention in an exploded view. The control unit comprises a circuit board 1, a semiconductor control element in the form of a transistor 2 as well as an interrupter element formed as a contact plate 3 and an actuating element formed by a punched deflector 4. Furthermore, a fusible pin 5 forming a fusible element as well as an injection moulded accommodation housing 6 accommodating the punched deflector 4 are realized.

On its top side assigned to the transistor 2 and the contact plate 3, the circuit board 1 exhibits tracks (not shown in the drawing) and which lead to the transistor 2. On its mounting side facing the circuit board 1 it has a so-called lead frame with which the transistor 2 is electrically connected to the at least one track formed on the top side of the circuit board 1. This track is broken by an actuating opening 7 cut out in the circuit board 1, so that two ends of the track lie free on the opposite sides of the actuating opening on the surface of the circuit board 1. Of course, also several mutually assigned ends of further tracks can be provided on the opposed sides of the actuating opening 7, which lead to the transistor 2.

On its rear side facing away from the contact plate 3 the transistor 2 has a number of connections 8 which are electrically connected to further tracks formed on the circuit board 1. The more "smart power control" functions the transistor exhibits, for example for temperature and/or current measurement, the more connections are required. The number of connections shown in FIG. 1 is only an example.

In the circuit board 1 below the transistor a number of holes 9 are provided. The holes are copper-plated and can fill with solder during the soldering process. The thermal track 10 formed in this way gives good thermal conduction from the transistor to the fusible pin 5 without the solder connection between the transistor and the circuit board being mechanically stressed, so giving rise to the risk of a poor electrical connection.

Figure 2:
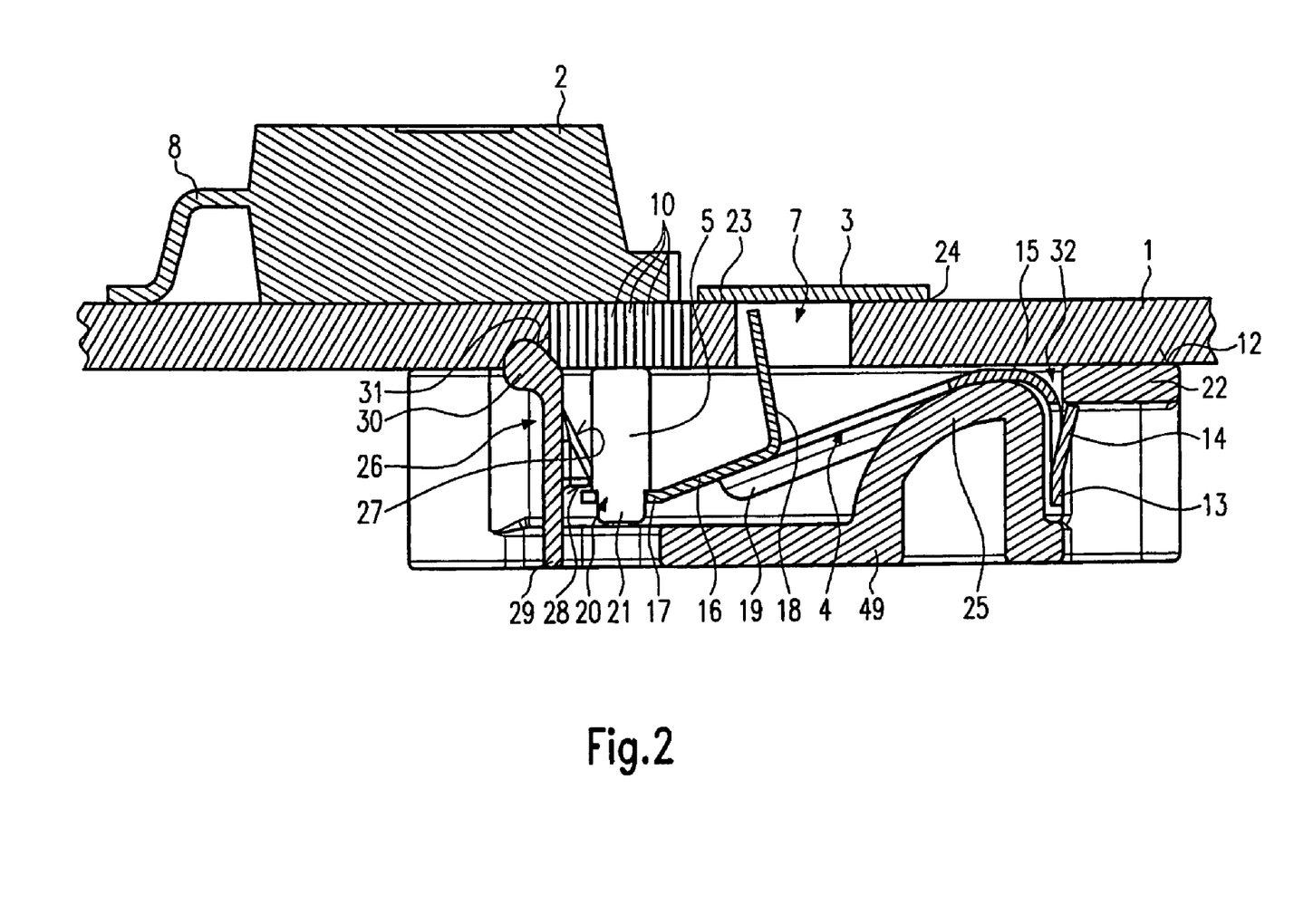
FIG. 2 the embodiment shown in FIG. 1 in a longitudinal section.

The accommodation housing 6 has an essentially H-shaped base area, the central web of which exhibits a recess 11 provided with a bottom 49 (cf. FIG. 2). The accommodation housing 6 forms a flat mounting surface 12 which can be contacted on the bottom side of the circuit board 1. On the lateral webs of the H-shaped accommodation housing 6 which essentially extend at right angles to the central web, locking elements, not shown here, are provided which engage locking holes, not shown and cut out on the circuit board 1, when the accommodation housing 6 is mounted on the circuit board 1 and, with its mounting surface 12, abuts the bottom side of the circuit board 1 forming the counter surface.

The punched deflector 4 is formed by a strip of sheet formed by punched processing and comprises a mounting segment 13 with a punched out locking lug 14 arranged in it, a curved segment 15 adjacent to the mounting segment 13 and in which elastic portions are stored in the mounted condition, through which a connecting segment 16 adjacent to the curved segment 15 as well as an accommodation segment 17 provided on the free end of the punched deflector 4 are pretensioned in the direction of the circuit board 1. The central section of the flat connecting segment 16 is cut free and bent over in the direction of the circuit board 1 to form an actuating web 18.

The connecting segment 16 also exhibits stiffening cheeks 19 bent in a direction opposite to the bending direction of the actuating web 18, which increase the bending stiffness of the connecting segment 16 and reduce the deflection of the connecting segment 16 due to a force acting in the longitudinal direction of the actuating web 18.

The accommodation segment 17 exhibits a hole 20 formed by punched processing, the diameter of which is slightly larger than a connecting peg 21 which is smaller in diameter compared to the fusible pin 5 and which is formed as a single part on the end of the fusible pin 5 on the mounting side.

The fusible pin 5 should be formed from plastic which melts at a predetermined melting temperature, for example between 100° C. and 180° C., if the control unit illustrated in the embodiment is to be switched off before overheating, for example before temperatures of over 300° C. The melting process starts on reaching the specified temperature. The lower limit of the specified temperature corresponds approximately to the temperature at which the solder becomes soft or melts. A preferred temperature for the start of the melting process is about 100° C. Preferably, the fusible pin is made from ABS or PVC in the shape of a cylinder with a diameter of for example 1.5 to 2 mm with a length of about 8 mm.

FIG. 2 shows a longitudinal section of the parts shown in an exploded view in FIG. 1. The same parts are given the same reference symbols. It can be seen that the fusible pin 5 is accommodated in the assembled state between the accommodation segment 17 and the circuit board 1. The fusible pin 5 is pressed on the bottom side of the circuit board 1 due to the pretension of the punched deflector 4. The end of the fusible pin 5 on the circuit board side thus contacts the through-contacted region 10 below the transistor, whereby the fusible pin 5 is coupled thermally to the transistor 2 via the thermal track.

The position of the accommodation housing 6 relative to the circuit board 1 is furthermore selected such that in the initial position of the punched deflector 4 shown in FIG. 2, in which it is pretensioned with respect to the circuit board 1, the actuating web 18 is accommodated in the actuating opening 7 with a slight distance to the contact plate 3.

The locking lug 14 of the punched deflector 4 grips behind a one-piece web 22 formed on the accommodation housing 6 and is consequently accommodated captively in the accommodation housing 6.

The contact plate 3 lies on the top side of the circuit board 1 and is connected to the circuit board 1 by means of a solder connection 23 on the transistor side and a solder connection 24 provided on the other side of the actuating opening 7. The solder connection 24 is only provided in the region of that face-side edge of the contact plate 3 which extends at right angles to the drawing plane in FIG. 2.

In the initial position illustrated in FIG. 2 the edge of the punched deflector 4 surrounding the hole 20 presses against a collar formed between the connecting peg 21 and the fusible pin 5. The fusible pin 5 holds the punched deflector 4 in its initial spring-pretensioned position illustrated in FIG. 2, in which the punched deflector with its curved segment 13 contacts a convex abutment 25 which is formed on the bottom 49 of the accommodation housing 6.

If overheating occurs in the region of the transistor 2, for example due to previous mechanical damage (e.g. due to "chip cracks") or an electrical overload ("electrical overstress") directly in the transistor 2, then the heat produced in the transistor 2 is transferred by thermal conduction to the solder connection 23 on the transistor side and to the fusible pin 5. The thermal conduction to the fusible pin occurs via the thermal track 10, whereas the distance between the transistor 2 and the solder connection 23 on the transistor side, i.e. the distance between the transistor 2 and the contact plate 3 is selected such that the heat dissipated by the transistor during impermissible heating of the transistor up to for example 300° C. leads to heating of the solder connection 24 above the melting temperature of the solder.

For this, the solder connection 23 on the transistor side can be formed in the immediate vicinity of the copper pins 10, which, due to their close packing in the circuit board 1, conduct heat preferably also in the board direction of the circuit board 1.

Due to the transferred heat, the fusible pin 5 melts slowly. On account of the spring pretension in the punched deflector 4, it follows the melted length of the fusible pin 5 so that the fusible pin 5 continues to abut the bottom side of the through-contacted region of the circuit board.

The end of the actuating web 18 on the actuating side, which is at the start in the initial position with a slight distance to the contact plate 3 and accommodated in the actuating opening 7, now presses against the contact plate 3. The heat produced by the transistor and conducted in the board direction to the solder connection 23 on the transistor side leads to the melting of the solder connection 23 on the transistor side. Since the actuating web 18 adjacent to the edge of the actuating opening 7 on the transistor side presses against the contact plate 3, it is then lifted from the circuit board 1 and swivelled about the other solder connection 24 which is decoupled thermally from the transistor 2 by the actuating opening 7, 50 that the solder of the other solder connection 24 remains solid. The solder connection 24, realized in the region of the edge of the contact plate 3, acts here as a hinge. When the contact plate 3 is raised from the circuit board, the contact of the two ends of the track formed on the surface of the circuit board 1 is interrupted. Further heating of the transistor 2 due to the current flowing through this track is then eliminated and the transistor 2 is protected against overheating.

The embodiment shown in FIGS. 1 and 2 exhibits a latching element 26 which facilitates the preassembly of the punched deflector 4 in a pretensioned state. This latching element 26 is illustrated in FIG. 2 in a position in which the latching element 26 fixes the punched deflector 4, held in the preassembled actuating element consisting of the punched deflector 4 and the accommodation housing 6, under pretension. In actual fact the latching element 26 is however located after mounting the preassembled actuating unit on the circuit board 1 in a position swivelled to the left with respect to the position shown in FIG. 2, which is described in more detail in the following.

As can be seen particularly from the illustration in FIG. 2, the latching element 26 is formed as an essentially plate-shaped component, which extends over the complete width of the cut-out 11. The latching element 26 exhibits on its inner surface facing the cut-out 11 a run-off ramp 27 which becomes wider downwards starting from the inner surface of the latching element 26. After this run-off ramp 27, an abutment surface 28 is arranged which extends essentially at right angles to the longitudinal extension of the latching element 26. In the preassembled position of the latching element 26 shown in FIG. 2 the punched deflector 4 grips the run-off ramp 27 behind with its accommodation segment 17 and contacts the abutment surface 28. The run-off ramp 27 is located at an edge of the plate-shaped latching element 26 and—in relation to the drawing plane according to FIG. 2—behind the fusible pin 5.

The latching element 26 is formed as a one-piece injection moulded part by means of a film hinge as part of the accommodation housing 6. The film hinge is situated in each case on the face-side end of the latching element 26 and connects it with the side walls of the cut-out 11 and in fact at the lower end 29 of the latching element 26. In the preassembled position of the latching element 26 shown in FIGS. 1 and 2 the other end of the latching element 26 overlaps the mounting surface 12 and exhibits a crimped head 30, sloping to the side facing away from the run-off ramp 27, and which forms a sloping sliding surface 31 in the sloping direction of the run-off ramp 27.

In the following the preassembly of the actuating unit is first described with reference to FIG. 1. The accommodation housing 6 is fixed and the punched deflector 4 with its mounting segment 13 is pushed so far into an accommodation slot 32 formed on the accommodation housing 6 between the web 22 and the convex abutment 25 until the locking lug 14 grips behind the web 22. Then the punched deflector 4 is fitted into the cut-out 11 essentially under elastic bending of the curved segment 15 by contacting the abutment 25. The accommodation segment 17 here entering the cut-out 11 interacts with the run-off ramp 27 at the end of this fitting movement and displaces the latching element 26 from the cut-out 11. The latching element 26 is here swivelled about its film hinges. In the region of the film hinge, elastic parts are impressed in the same. When the accommodation segment 17 has passed the transition between the run-off ramp 27 and the abutment surface 28, the latching element 26 is swivelled back due to the elastic portions in the direction of the cut-out 11. The abutment surface 28 is here brought over the accommodation segment 17. The punched deflector 4 is now fixed under pretension in the preassembled actuating unit formed by the punched deflector 4 and the accommodation housing 6 with the latching element 26.

This securing of the punched deflector 4 can however be solved by swivelling the latching element 26 out of the cut-out 11. This swivel movement is forcibly superimposed during the attachment of the preassembled actuating unit in the following described manner. The preassembled actuating unit is brought under the circuit board 1 and in fact such that the locking holes provided on the circuit board 1 are flush with the locking elements formed on the accommodation housing 6. The fusible pin 5 was preferably fitted in a preceding assembly step with its connecting peg 21 in the hole 20 of the punched deflector 4.

Now the preassembled actuating unit and the circuit board 1 are brought together. Here, first the end of the actuating web 18 on the actuating side enters the actuating opening 7. With progressive movement the head 30 is placed with its sliding surface 31 on the bottom side of the circuit board 1 and slides with its sliding surface 31 on the bottom side of the circuit board 1. This produces the swivel movement of the latching element 26 about its lower end 29 from the cut-out 11, through which the locking connection between the punched deflector 4 and the abutment surface 28 of the latching element 26 is cancelled. Finally, the preassembled actuating unit is clipped to the circuit board 1 by latching the locking elements on the circuit board 1. The latching element 26 is now situated in a position swivelled to the left in relation to the illustration in FIG. 2 and in which the run-off ramp 27 is displaced with the abutment surface 28 assigned to it so far out of the cut-out 11 that it presents no resistance to an ensuing movement of the punched deflector 4 with a melting fusible pin 5.

The preassembled actuating unit described above offers the advantage in that the punched deflector 4, held under pretension in the preassembled state, is inevitably released on fitting the preassembled actuating unit onto the circuit board 1. Accordingly, the development enables not only a simplified assembly of the temperature protection system on the circuit board 1, but rather also prevents assembly errors and improves accordingly the reliability of the overheating protection.

The control unit according to the invention with the thermal protection element can be used anywhere where a development of heat originating from the control unit represents a hazard for the overall device. According to the invention, overheating and the consequential damage it causes can be reliably prevented. Preferably, this invention is used in electrical auxiliary heaters for motor vehicles and specifically both in auxiliary heaters with an integral control unit as well as in auxiliary heaters with a separate control unit.

Figure 3:
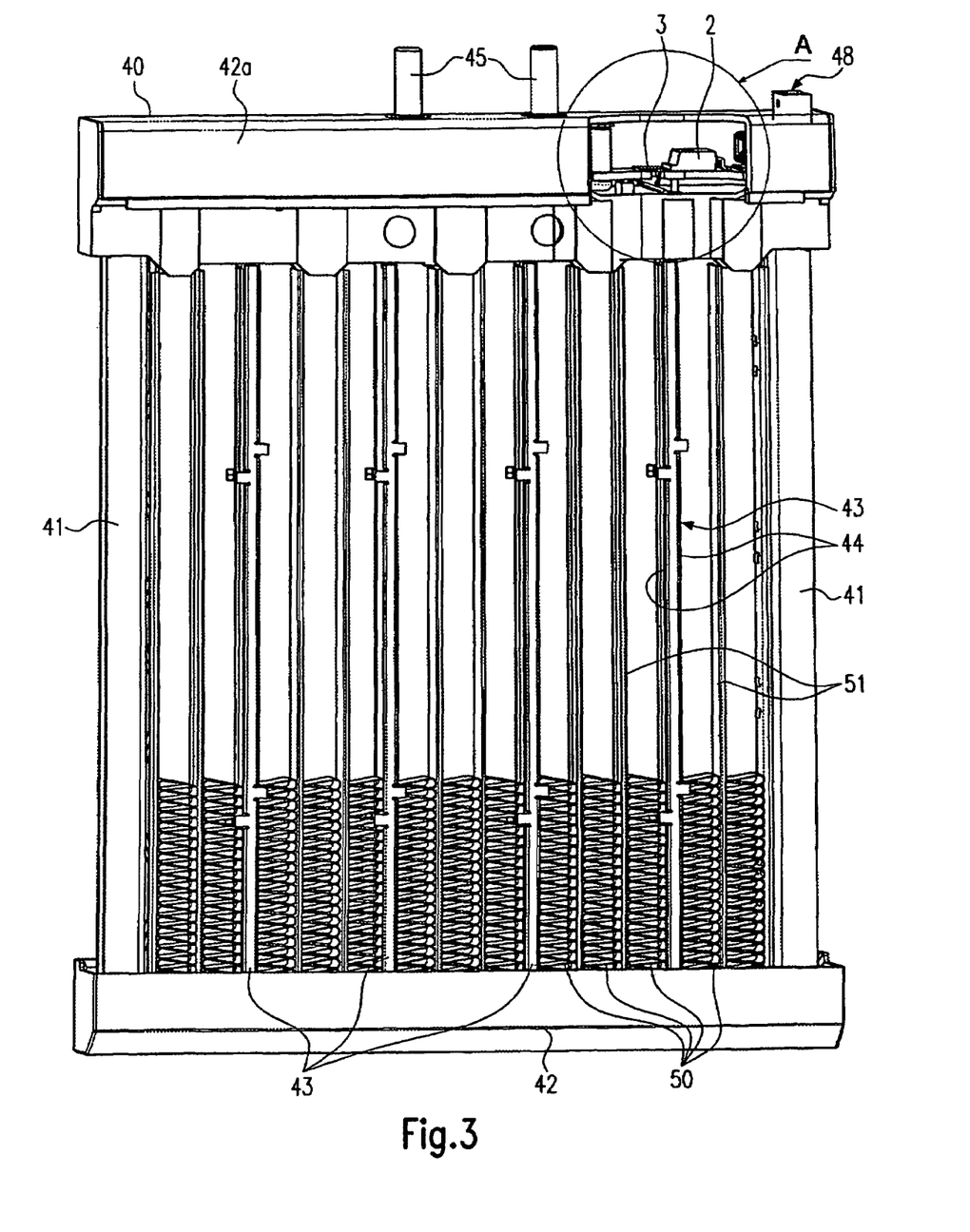
FIG. 3 an embodiment of an electrical heating device as auxiliary heater for a motor vehicle with an embodiment of a control unit according to the invention.
Figure 4:
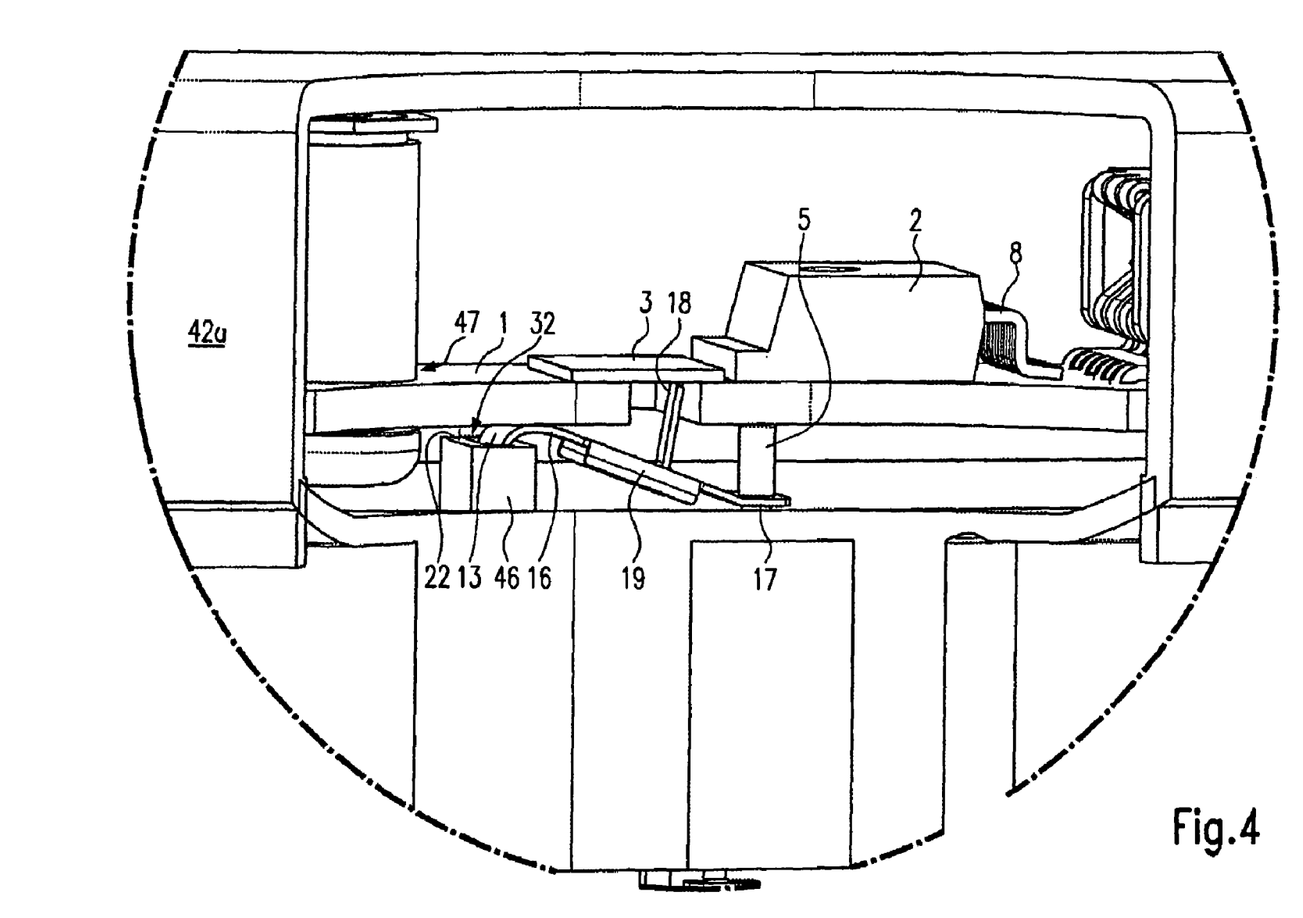
FIG. 4 the section A according to the illustration in FIG. 3 in enlarged form.

FIGS. 3 and 4 show an embodiment of an electrical heating device for a motor vehicle with a further embodiment of a control unit according to the invention which forms a constructional unit with the heating elements in a common housing. The housing shown in FIG. 3 is only an example. This invention can also be integrated into any other form of housing.

The electrical heating device shown in FIG. 3 possesses a frame-shaped housing 40, which is formed by two longitudinally extending indented metal webs or longitudinal spars 41 and two injection moulded plastic webs or lateral spars 42 extending at right angles to them. The electrical heating device exhibits layers of radiator elements 50 extending parallel to the longitudinal spars 41 and heat dissipating layers 43. Each of the heat dissipating layers comprises one or more PTC heating elements, which are held between two parallel electrically and thermally conducting contact plates 44, and are in particular clamped. These contact plates 44 can be formed as separate components in the form of flat profile strips or by the flat outer surface of radiator elements, which for example are made by aluminium extruding machines. The essential feature for the functioning of the contact plates is only good thermally and electrically conducting support of the PTC heating elements on the oppositely situated contact plates 44. Here, the radiator elements 50 are in each case formed by a string of meander-shaped curved radiator plates.

With the embodiment illustrated in FIG. 3 four heat dissipating layers 43 are provided, the contact plates 44 of which are held electrically insulated from one another in the webs 42. The upper retaining web 42a in FIG. 3 is formed box shaped and contains a control unit for setting the current to be passed to the PTC heating elements. The upper retaining web 42a is overlapped by two electrical connecting pins 45 through which the electrical connection of the illustrated heating device to the onboard network of a motor vehicle occurs. The heating current applied to one of the connecting pins 45 is switched on or off by the transistors 2 assigned to the thermally dissipating layers, so that the heating power of the electrical heating device can be controlled step by step.

One of the heating stages can be designed such that the heating power of this stage is continuously adjustable, so that the overall heating power can be dosed more accurately and sudden temperature changes in the air fed to the interior are avoided.

The overheating protection for the transistor 2 carrying out this control is shown in FIG. 4. The same components are identified here with the same reference symbols as used in FIGS. 1 and 2. In contrast to the previously described embodiment, the punched deflector with its mounting segment 13 is located in a cylindrical mounting protrusion 46, which forms the accommodation slot 32 and the web 22 for latching the punched deflector 4. The mounting protrusion 46 is formed as a one-piece component on the retaining web 42a by injection moulding.

The heating current from the connection bolts 45 is distributed via the bolts 47 illustrated in FIG. 4 to the individual heating stages.

The embodiment shown in FIGS. 3 and 4 can just as well exhibit a preassembled mounting unit, which is brought into a specified position by insertion into the upper retaining web 42a, in which position the tracks applied to the circuit board 1 are electrically connected to the thermally dissipating elements 43 and, by them, to one of the connecting pins 45. The electrical connection of the transistors 2 to the other connecting pin 45 can for example occur by insertion and/or soldering of electrical contact elements, which also connect the other connections 8 with an indicated plug element 48 for control leads to the transistor 2.

Summarising, according to the invention a control unit with a thermal protection element is provided, in that interruption of the current feed during an impermissibly high temperature is facilitated with the highest possible reliability. For this purpose, a track section which feeds the current to be switched off to a semiconductor switching element is mechanically interrupted. For this purpose, underneath the track a pretensioned actuating element is arranged which interrupts the track at a temperature above the adjustable limit temperature.

We claim:

1. An electrical heating device comprising:
    a device housing,
    a layered structure held by the housing device and including at least one radiator element,
    at least one contact plate and at least one thermally dissipating element, and
    a control unit controlling the heater power of the at least one thermally dissipating element, the control unit including
        a circuit board including at least one track,
        a transistor for controlling a current fed to the at least one thermally dissipating element, the transistor being mounted on the circuit board and electrically connected to at least one track,
        an interrupter element which in its initial position electrically connects opposite facing ends of the at least one track,
        a fusible element that is thermally coupled to the transistor, and
        an actuating element which is pretensioned by the fusible element, which is activated when the fusible element has been fused by overheating of the transistor and which acts against the interrupter element on actuation and releases the interrupter element from the circuit board at least so far that the electrical connection is interrupted.

2. The electrical heating device according to claim 1, wherein the fusible element is arranged on the side of the circuit board facing away from the transistor, and wherein the circuit board has a thermal track extending between the fusible element and the transistor.

3. The electrical heating device according to claim 1, wherein the interrupter element is formed by a contact plate soldered on the circuit board, and wherein the solder connection is thermally coupled to the transistor.

4. The electrical heating device according to claim 3, wherein the circuit board has an actuating opening which is cut out under the contact plate and which receives an end of the actuating element in the initial position thereof.

5. The electrical heating device according to claim 4, wherein a latching element overlaps a mounting surface of the accommodation housing before connection of the accommodation housing to the circuit board, and wherein the latching element is supported for swiveling on the accommodation housing and exhibits a run-off ramp, wherein the run-off ramp interacts with the actuating element during the preassembly and is followed by a mounting surface which holds the preassembled actuating element under pretension.

6. The electrical heating device according to claim 1, wherein the actuating element is formed by a punched deflector which comprises an elastically bent curved segment, an accommodation segment provided with a receptacle for holding the fusible element, a connecting segment extending between the curved segment and the accommodation segment, and an actuating web which is cut from the connecting segment and which extends at approximately at a right angle to the circuit board.

7. The electrical heating device according to claim 1, further comprising an accommodation housing in which the actuating element is preassembled, wherein the actuating element is held in the accommodation housing under initial pretension by a latching element which releases the actuating element after the accommodation housing is connected to the circuit board.

8. The electrical heating device according to claim 7, wherein the accommodation housing is formed together with the latching element as a one-piece injection moulded part.

9. The electrical heating device according to claim 7, wherein the accommodation housing is latched to the circuit board.

10. The electrical heating device according to claim 7, wherein a punched deflector is latched in the accommodation housing.

11. The electrical heating device according to claim 10, wherein the accommodation housing comprises an accommodation slot for holding a mounting segment of the punched deflector connecting to the curved segment.

12. The electrical heating device according to claim 1, further comprising an accommodation housing which comprises a lateral strut extending laterally to at least one thermally dissipating elements and which spaces them for electrical insulation, wherein the circuit board and the actuating element are held by the lateral strut.

* * * * *